United States Patent
Zhang et al.

(10) Patent No.: US 11,500,590 B2
(45) Date of Patent: Nov. 15, 2022

(54) METHOD, DEVICE AND COMPUTER PROGRAM PRODUCT FOR DATA WRITING

(71) Applicant: EMC IP Holding Company LLC, Hopkinton, MA (US)

(72) Inventors: Leihu Zhang, Beijing (CN); Chen Gong, Beijing (CN); Shuo Lv, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 17/205,542

(22) Filed: Mar. 18, 2021

(65) Prior Publication Data

US 2022/0214833 A1 Jul. 7, 2022

(30) Foreign Application Priority Data

Jan. 6, 2021 (CN) .......................... 202110013351.6

(51) Int. Cl.
*G06F 3/06* (2006.01)
*H03M 7/30* (2006.01)
(52) U.S. Cl.
CPC .......... *G06F 3/0659* (2013.01); *G06F 3/0626* (2013.01); *G06F 3/0644* (2013.01); *G06F 3/0673* (2013.01); *H03M 7/30* (2013.01)
(58) Field of Classification Search
CPC .... G06F 3/0659; G06F 3/0626; G06F 3/0644; G06F 3/0673; G06F 12/00; G06F 13/00; H03M 7/30
See application file for complete search history.

(56) References Cited

U.S. PATENT DOCUMENTS

| | | | |
|---|---|---|---|
| 6,449,689 B1* | 9/2002 | Corcoran | G06F 3/0676 711/159 |
| 8,539,191 B2* | 9/2013 | Pawar | G06F 3/064 711/170 |
| 10,156,993 B1 | 12/2018 | Armangau et al. | |
| 10,430,376 B1 | 10/2019 | Armangau et al. | |
| 10,949,107 B1 | 3/2021 | Basov et al. | |
| 11,048,419 B2 | 6/2021 | Armangau et al. | |
| 11,216,186 B1 | 1/2022 | Armangau et al. | |
| 2017/0185312 A1* | 6/2017 | Smith | G06F 3/0644 |
| 2018/0314528 A1* | 11/2018 | Zhu | G06F 9/3851 |

* cited by examiner

*Primary Examiner* — Tuan V Thai
(74) *Attorney, Agent, or Firm* — BainwoodHuang (57) ABSTRACT

Techniques for data writing involve: determining an unavailable storage zone in multiple storage zones of a storage area, wherein each storage zone is used to store a zip header and compressed data corresponding to the zip header; acquiring a reference zip header for the unavailable storage zone, wherein the reference zip header includes metadata indicating a zone length of the unavailable storage zone; and generating consecutive write requests for the storage area based at least on target data to be written to the storage area and the reference zip header, so as to write the target data to available storage zones in the multiple storage zones. Accordingly, rewriting of data can be implemented by constructing large consecutive write requests, thus improving the write performance of the storage device.

20 Claims, 5 Drawing Sheets

METHOD, DEVICE AND COMPUTER PROGRAM PRODUCT FOR DATA WRITING

CROSS-REFERENCE TO RELATED APPLICATION

This application claims priority to Chinese Patent Application No. CN202110013351.6, on file at the China National Intellectual Property Administration (CNIPA), having a filing date of Jan. 6, 2021 and having "METHOD, DEVICE AND COMPUTER PROGRAM PRODUCT FOR DATA WRITING" as a title, the contents and teachings of which are herein incorporated by reference in their entirety.

TECHNICAL FIELD

Embodiments of the present disclosure relate to the field of computers, and in particular to a method, a device, and a computer program product for data writing.

BACKGROUND

In order to reduce the storage space occupied by data in a storage device, the data can be compressed at a certain compression ratio before it is written to a storage area. When the storage area is written with data (e.g., input/output (I/O) instructions) compressed at a certain compression ratio for a first time, the data is consecutive within the storage area. Subsequent data can be rewritten to the same storage area to overwrite the original data.

A physical storage area can be divided into several zones of a page size according to a paging management solution, wherein the page size is the minimum allocation unit of 4 KB or 8 KB. If the subsequent data has a higher compression ratio than the original data, the subsequent data is usually non-consecutive within the same storage area and there is a gap (also called a "void") between the subsequent data and the original data. In addition, some original data may also be recycled and marked as unavailable and become gaps that affect data writing.

SUMMARY OF THE INVENTION

The embodiments of the present disclosure provide a solution for data writing.

According to a first aspect of the present disclosure, a method for data writing is proposed. The method includes: determining an unavailable storage zone in multiple storage zones of a storage area, wherein each storage zone is used to store a zip header and compressed data corresponding to the zip header; acquiring a reference zip header for the unavailable storage zone, wherein the reference zip header includes metadata indicating a zone length of the unavailable storage zone; and generating consecutive write requests for the storage area based at least on target data to be written to the storage area and the reference zip header, so as to write the target data to available storage zones in the multiple storage zones.

According to a second aspect of the present disclosure, an electronic device is proposed. The device includes: at least one processing unit; and at least one memory which is coupled to the at least one processing unit and stores instructions for execution by the at least one processing unit, wherein the instructions, when executed by the at least one processing unit, cause the device to perform actions including: determining an unavailable storage zone in multiple storage zones of a storage area, wherein each storage zone is used to store a zip header and compressed data corresponding to the zip header; acquiring a reference zip header for the unavailable storage zone, wherein the reference zip header includes metadata indicating a zone length of the unavailable storage zone; and generating consecutive write requests for the storage area based at least on target data to be written to the storage area and the reference zip header, so as to write the target data to available storage zones in the multiple storage zones.

In a third aspect of the present disclosure, a computer program product is provided. The computer program product is stored in a non-transitory computer storage medium and includes machine-executable instructions that, when run in a device, cause the device to perform any step of the method described according to the first aspect of the present disclosure.

The Summary of the Invention section is provided in order to introduce the selection of concepts in a simplified form, which will be further described in the Detailed Description below. The Summary of the Invention section is not intended to identify key features or essential features of the present disclosure, nor is it intended to limit the scope of the present disclosure.

BRIEF DESCRIPTION OF THE DRAWINGS

The above and other objects, features, and advantages of the present disclosure will become more apparent by describing the example embodiments of the present disclosure in more detail in combination with the accompanying drawings. In the example embodiments of the present disclosure, the same reference numerals generally represent the same parts.

DETAILED DESCRIPTION

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

It should be understood that the specialized circuitry that performs one or more of the various operations disclosed herein may be formed by one or more processors operating in accordance with specialized instructions persistently stored in memory. Such components may be arranged in a variety of ways such as tightly coupled with each other (e.g., where the components electronically communicate over a computer bus), distributed among different locations (e.g., where the components electronically communicate over a computer network), combinations thereof, and so on.

Preferred embodiments of the present disclosure will be described in more detail below with reference to the accompanying drawings. Although the preferred embodiments of the present disclosure are shown in the accompanying drawings, it should be understood that the present disclosure can be implemented in various forms and should not be limited by the embodiments set forth herein. Instead, these embodiments are provided to make the present disclosure more thorough and complete, and to fully convey the scope of the present disclosure to those skilled in the art.

The term "include" and variants thereof as used herein indicate open-ended inclusion, i.e., "including but not limited to." Unless specifically stated, the term "or" means "and/or." The term "based on" means "based at least in part on." The terms "an example embodiment" and "an embodiment" indicate "at least one example embodiment." The term "another embodiment" indicates "at least one additional embodiment." The terms "first," "second," and the like, may refer to different or the same objects. Other explicit and implicit definitions may also be included below.

Modern storage systems (e.g., all-flash array (AFA) storage devices) using the real-time data compression (Iterative Length Compression, ILC) technology can provide significant reduction of the use of disk space. As mentioned earlier, a storage area is divided into multiple storage zones in accordance with a page size. When data is rewritten in a sector of the storage area where original data was previously stored, no change in metadata is caused. If the rewritten data has the same compression ratio as the original data (i.e., a ratio of an amount of data before compression to an amount of data after compression), the storage space of the storage area can be fully utilized, and the rewritten data is written to a backend driving device in a consecutive manner.

However, the inventors found that if the rewritten data has a higher compression ratio than that of the original data, it would cause the originally consecutive data to be stored in a non-consecutive manner and leave gaps between storage zones. In addition, some original data may be recycled, in which case the metadata will be modified to indicate that the corresponding storage zone is unavailable, and the stored original data will not be replaced. The conventional data rewriting process will be described in detail below with reference to FIGS. 1A to 1D.

Figure 1A:
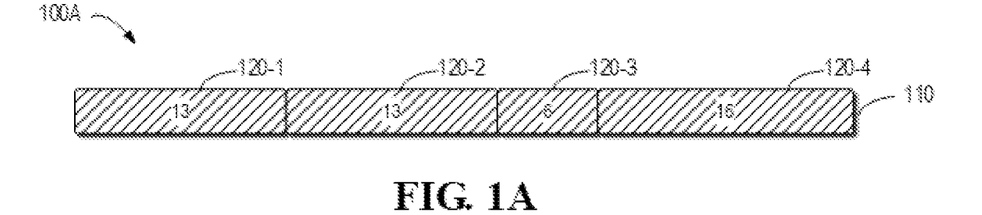
FIGS. 1A-1D illustrate a schematic diagram of conventional data rewriting.

As shown in FIG. 1A, storage area 110 includes four storage zones 120-1, 120-2, 120-3, and 120-4 (individually or collectively referred to as storage zones 120). Each storage zone 120 stores original data of different sizes. For example, the length of storage zone 120-1 is 13 sectors, the length of storage zone 120-2 is 13 sectors, the length of storage zone 120-3 is 6 sectors, and the length of storage zone 120-4 is 16 sectors.

Figure 1B:
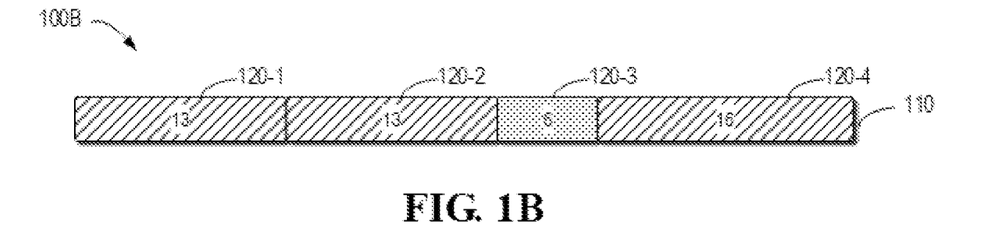

In FIG. 1B, the data in storage zone 120-3 is recycled, so that storage zone 120-3 is marked as unavailable. In this case, the user will not be able to access this storage zone 120-3 or to write data to this storage zone 120-3. It should be understood that, based on the ILC technology, the original data stored in this storage zone 120-3 will not be deleted, but only the corresponding metadata is modified to indicate that this storage zone 120-3 is unavailable.

Figure 1C:
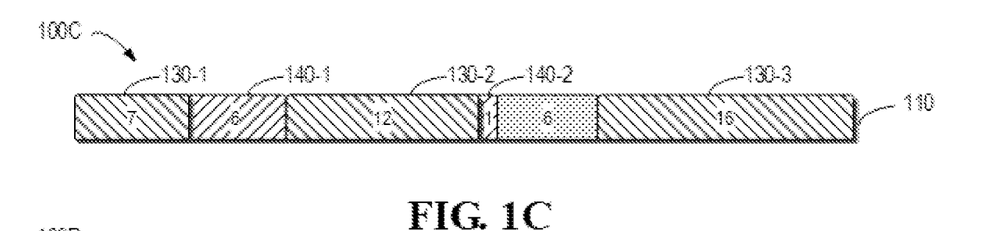

In FIG. 1C, target data 130 (also referred to as rewritten data 130) includes three items of rewritten data that need to be written to storage area 110 to overwrite the original data. Specifically, the first item of rewritten data 130-1 has a length of 7 sectors, the second item of rewritten data 130-2 has a length of 12 sectors, and the third item of rewritten data 130-3 has a length of 16 sectors.

In this case, the first item of rewritten data will be written to storage zone 120-1 and result in void 140-1 having a length of 6 sectors; and the second item of rewritten data will be written to storage zone 120-2 and result in void 140-2 having a length of 1 sector.

As shown in FIG. 1C, in this case, 3 voids will be generated, namely void 140-1, void 140-2, and unavailable storage zone 120-3.

Figure 1D:
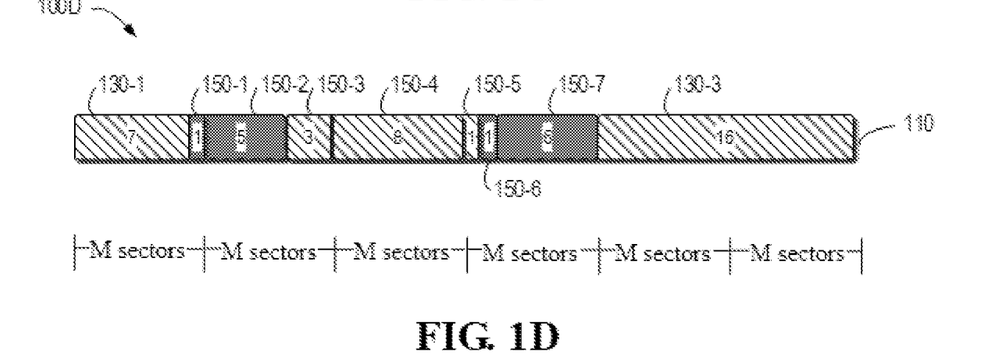

According to the conventional solution, consecutive write requests can be constructed by writing padding data. For example, as shown in FIG. 1D, the write requests can be constructed according to the storage granularity (e.g., M sectors per storage page, with M being 8, for example) of the storage area.

For example, the first item of rewritten data 130-1 (having a length of 7 sectors) can be combined with padding data 150-1 having a length of 1 sector as the written data for the first 8 sectors. Data 150-3 of the first 3 sectors in the second item of rewritten data 130-2 can be combined with padding data 150-2 having a length of 5 sectors as the written data for the second 8 sectors.

However, the conventional solution cannot efficiently process unavailable storage zone 120-3. Some conventional solutions do not process unavailable storage zone 120-3 to avoid affecting useful data in unavailable storage zone 120-3. However, this will cause the constructed write requests to be non-consecutive, affecting the write performance of the storage system.

In addition, some conventional solutions construct consecutive write requests by simply rewriting unavailable storage zone 120-3 by writing padding data (for example, writing 0s). However, since unavailable storage zone 120-3 includes zip header information, such a zip header can help reconstruct backup metadata (e.g., a VBM file). If the zip header in unavailable storage zone 120-3 is directly overwritten, this will cause the file system to be unable to reconstruct the backup metadata.

Figure 2:
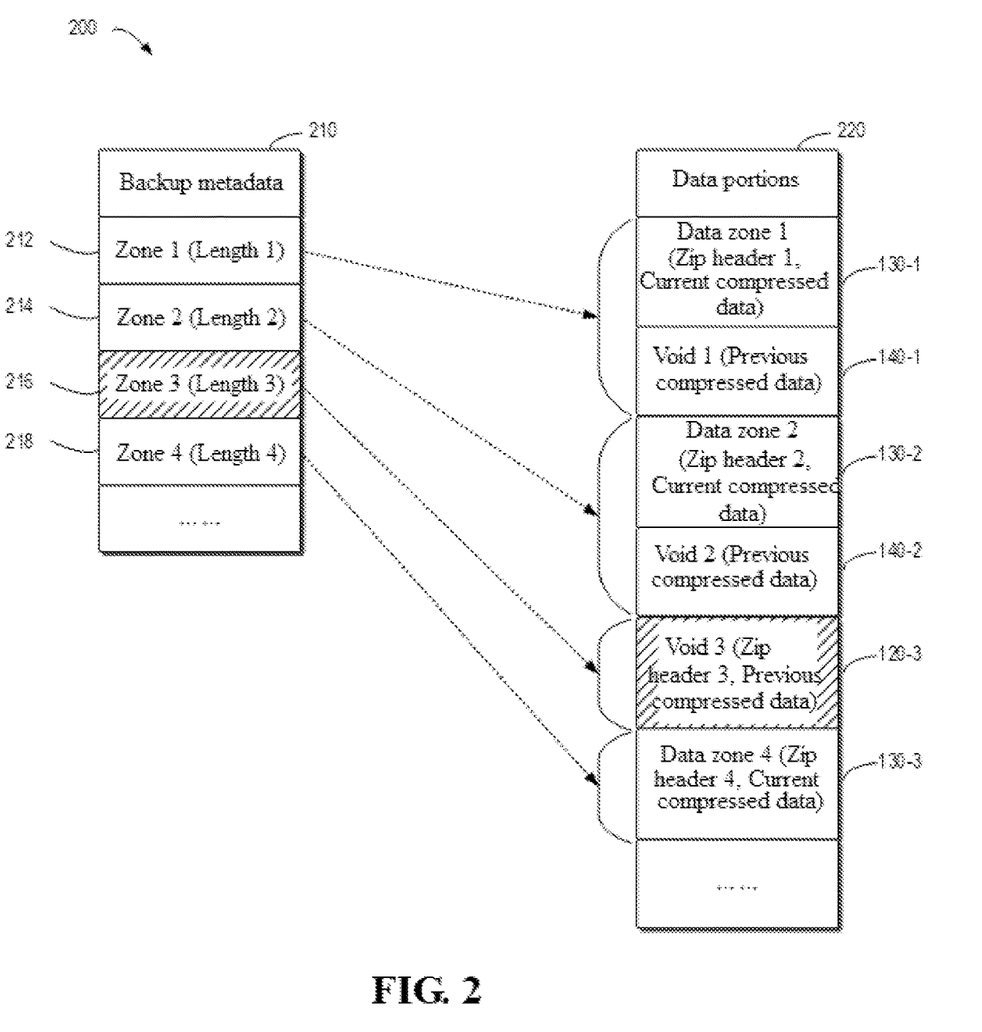
FIG. 2 illustrates a schematic diagram of mapping between backup metadata and compressed data.

FIG. 2 illustrates schematic diagram 200 of mapping between backup metadata and compressed data. As shown in FIG. 2, backup metadata 210 can maintain metadata corresponding to different storage zones 120, and its length is used to indicate the starting position of each zone 120, thereby constructing the mapping between the metadata and data portions 220.

By way of example, corresponding to the example in FIG. 1C, backup metadata 210 includes backup metadata 212, 214, 216, and 218 corresponding to the four storage zones 120, respectively. Each item of backup metadata can maintain corresponding length information to be directed to the corresponding data portion.

For example, backup metadata 212 may correspond to the first item of rewritten data 130-1 (which includes a zip header and corresponding compressed data) and void 140-1; backup metadata 214 may correspond to the second item of rewritten data 130-2 and void 140-2; backup metadata 216 may correspond to unavailable storage zone 120-3; and backup metadata 218 may correspond to the third item of rewritten data 130-3.

As can be seen, if the zip header included in unavailable rewritten data 120-3 is overwritten, this will cause the file system to be unable to reconstruct the backup metadata according to the zip header included in data portion 220 once backup metadata 210 becomes corrupted.

According to the embodiments of the present disclosure, a solution for data writing is provided. This solution enables the efficient construction of large consecutive writing by rewriting the zip header corresponding to the length of the unavailable storage zone. In addition, this solution retains useful information in the zip header, thus enabling support for reconstruction of the backup metadata.

Figure 3:
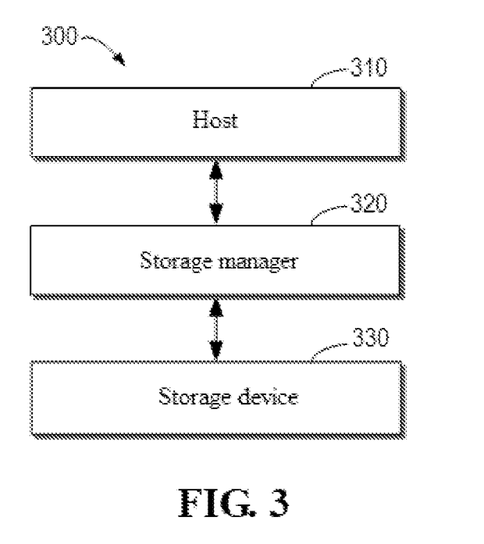
FIG. 3 illustrates a schematic diagram of an example environment where the embodiments of the present disclosure can be implemented.

The embodiments of the present disclosure will be specifically described below with reference to the accompanying drawings. FIG. 3 illustrates a schematic diagram of example environment 300 for data writing according to embodiments of the present disclosure. As shown in FIG. 3, example environment 300 includes host 310, storage manager 320, and storage device 330. It should be understood that the structure of example environment 300 is described for illustrative purpose only and does not imply any limitation to the scope of the present disclosure. For example, the embodiments of the present disclosure may also be applied to an environment different from example environment 300.

Host 310 may be, for example, any physical computer, virtual machine, server, etc., running user applications. Host 310 can send an I/O request to storage manager 320, for example, for reading data from storage device 330 and/or writing data to storage device 330. In response to receiving a read request from host 310, storage manager 320 can read data from storage device 330 and return the read data to host 310. In response to receiving a write request from host 310, storage manager 320 can write data to storage device 330. Storage device 330 can be any non-volatile storage medium currently known or to be developed in future, such as a disk, a solid state disk (SSD) or disk array (RAID), etc.

Storage manager 320 can be deployed with a compression/decompression engine (not shown). For example, when storage manager 320 receives a request from host 310 to write data to storage device 330, storage manager 320 can use the compression/decompression engine to compress the data to be stored and then store the compressed data to storage device 330.

As described above, storage manager 320 is capable of constructing consecutive write requests while storage manager 320 is performing data writing. The detailed process of data writing according to embodiments of the present disclosure will be described below in combination with FIGS. 4 to 5.

Figure 4:
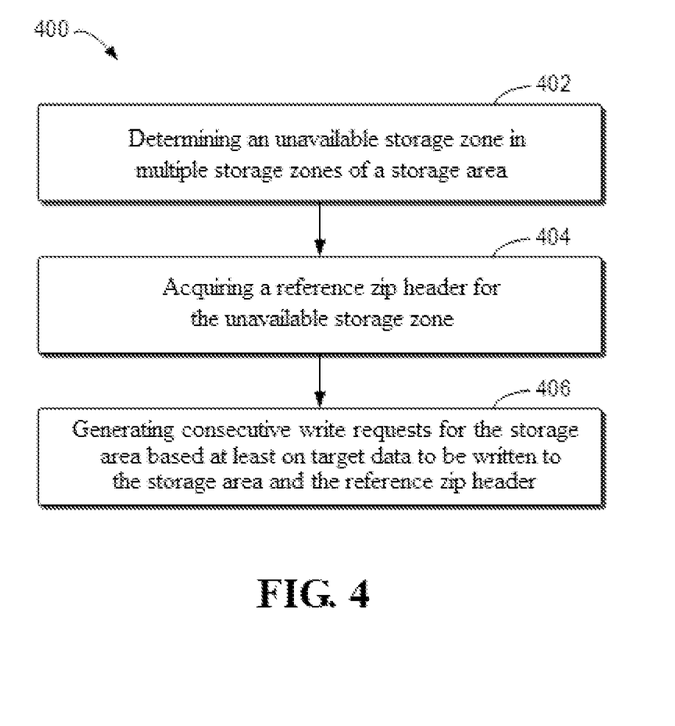
FIG. 4 illustrates a flowchart of a process of data writing according to embodiments of the present disclosure.

FIG. 4 illustrates a flowchart of example process 400 for data writing according to embodiments of the present disclosure. For example, process 400 may be performed by storage manager 320 as shown in FIG. 3. It should be understood that process 400 may also be performed by any other suitable device and may include additional actions not shown and/or may omit the actions shown, and the scope of the present disclosure is not limited in this regard. For ease of description, process 400 will be described below with reference to FIGS. 1 to 3.

At block 402, storage manager 320 determines unavailable storage zone 120-3 in multiple storage zones 120 of storage area 110, wherein each storage zone 120 is used to store a zip header and compressed data corresponding to the zip header.

As shown in FIG. 1, upon receiving a rewrite request to write the target data to storage area 110, storage manager 320 may indicate that storage area 110 includes unavailable storage zone 120-3.

In some implementations, storage zone 120-3 may be marked as unavailable in response to being recycled. Alternatively, storage zone 120-3 may also be marked as unavailable in response to receiving a rewrite request with a data size larger than the length of that storage zone.

In some implementations, storage manager 320 may mark storage zone 120-3 as unavailable by modifying the metadata corresponding to storage zone 120-3, without deleting the compressed data stored in storage zone 120-3. Such an unavailable storage zone 120-3 will not be accessible, thus creating the voids (or, gaps) described above.

At block 404, storage manager 320 acquires a reference zip header for unavailable storage zone 120-3, wherein the reference zip header includes metadata indicating the zone length of the unavailable storage zone.

In some implementations, in order to enable storage manager 320 to construct consecutive write requests without affecting the zip header included in unavailable storage zone 120-3, storage manager 320 can pre-construct a set of candidate zip headers.

Figure 5:
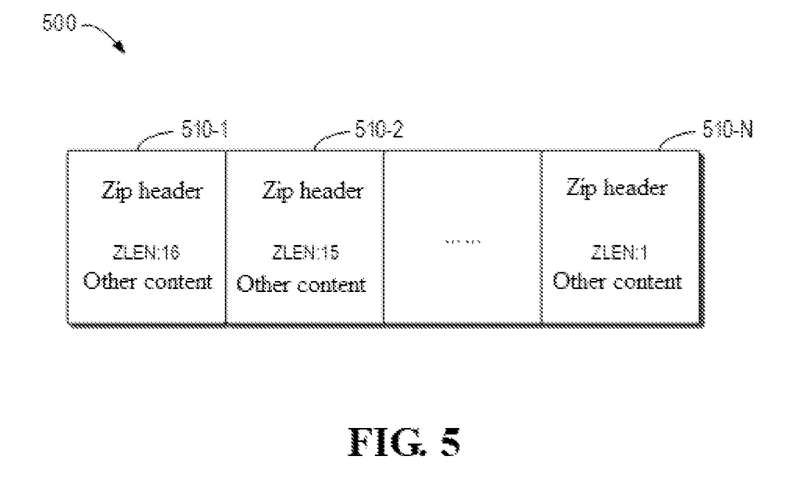
FIG. 5 illustrates a schematic diagram of candidate zip headers according to embodiments of the present disclosure.

FIG. 5 illustrates schematic diagram 500 of candidate zip headers according to embodiments of the present disclosure. As shown in FIG. 5, storage manager 320 can allocate a buffer of a predetermined size in a memory for storing a set of candidate zip headers 510-1, 510-2, to 510-N (individually or collectively referred to as candidate zip headers 510).

As shown in FIG. 5, each candidate zip header 510 corresponds to a different zone length (ZLEN). For example, candidate zip header 510-1 corresponds to a zone having a zone length of 16 sectors and stores metadata indicating that the zone length is 16 sectors. Candidate zip header 510-2 corresponds to a zone having a zone length of 15 sectors and stores metadata indicating that the zone length is 15 sectors.

Since the file system needs to utilize only the zone length information in the zip header when reconstructing backup metadata, candidate zip header 510-1 may also include other appropriate metadata for verification purposes. It should be understood that other metadata can be initialized as any appropriate content, and the present disclosure is not intended to be limiting in this respect.

After completing the construction of the set of candidate zip headers 510, storage manager 320 can use this set of candidate zip headers 510 to determine a reference zip header corresponding to unavailable storage zone 120-3.

Specifically, storage manager 320 can determine the zone length of unavailable storage zone 120-3. Taking FIG. 1C as an example, storage manager 320 determines that the zone length of this unavailable storage zone 120-3 is 6 sectors according to the metadata (e.g., the VBM file) in the memory, for example.

Storage manager 320 can determine an index for the reference zip header based on the zone length. By way of example, depending on the order in which the set of candidate zip headers 510 are organized, different zone lengths may correspond to different indexes. For example, in FIG. 5, candidate zip headers 510 are arranged in a descending order of the zone length, and accordingly, the index corresponding to the zone length (6) may be determined as 10, i.e., indicating the 11th candidate zip header in the set of candidate zip headers 510.

Additionally, storage manager 320 determines, based on the index, the reference zip header from the set of candidate zip headers 510 corresponding to different zone lengths. Taking FIG. 5 as an example, storage manager 320 can determine the 11th candidate zip header as the reference zip header for unavailable storage zone 120-3.

Continuing to refer to FIG. 2, at block 406, storage manager 320 generates consecutive write requests for storage area 110 based at least on target data 130 to be written into the storage area and the reference zip header, so as to write the target data to available storage zones in the multiple storage zones 120.

In some implementations, for unavailable storage zone 120-3, storage manager 320 can generate zone padding data for the unavailable storage zone using the reference zip header, wherein the zone padding data includes the reference zip header and first padding data that is used to overwrite compressed data previously stored in the unavailable storage zone.

Taking FIG. 1C as an example, storage manager 320 can generate zone padding data for unavailable storage zone 120-3, wherein the first sector may be padded using the reference zip header and the remaining 5 sectors may be padded using a predetermined value (e.g., 0).

Additionally, storage manager 320 can generate consecutive write requests based at least on target data 130 and the zone padding data. Specifically, if data in only a portion of the available storage zones in the multiple storage zones 120 needs to be overwritten by the target data, storage manager 320 can determine a remaining portion of the available storage zones that does not need to be replaced with the target data.

Taking FIG. 1C as an example, storage zone 120-1 includes the remaining portion that is not overwritten, that is, void 140-1. Storage zone 120-2 includes the remaining portion that is not overwritten, that is, void 140-2.

Storage manager 320 can generate the second padding data for the remaining portion. By way of example, storage manager 320 can generate the second padding data by writing a predetermined value (e.g., 0).

Additionally, storage manager 320 can generate the consecutive write requests based on the target data, the zone padding data, and the second padding data. As shown in FIG. 1C, according to the solution of the present disclosure, storage manager 320 can determine that the first 7 sectors of storage zone 120-1 will be written with first rewritten data 130-1 and the next 6 sectors will be written with the padding data; the first 12 sectors of storage zone 120-2 will be written with second rewritten data 130-2 and the next 1 sector will be written with the padding data; storage zone 120-3 will be written with the padding data; and storage zone 120-4 will be written with third rewritten data 130-3. Based on this approach, storage manager 320 can generate large consecutive write requests.

In some implementations, in order to enable the written data to align with the storage granularity of storage area 110, storage manager 320 can also determine multiple data portions from the target data, the zone padding data, and the second padding data according to the storage granularity associated with storage area 110, wherein the size of each data portion corresponds to the storage granularity.

Taking FIG. 1D as an example, if the storage granularity (i.e., the size of each storage page) of storage area 110 is 8 sectors, storage manager 320 can further slice the consecutive data determined above into multiple data portions having a size of 8 sectors. For example, first rewritten data 130-1 and padding data 150-1 form a first data portion; padding data 150-2 and data 150-3 of the first 3 sectors of the second item of rewritten data 130-2 form a second data portion; data 150-4 of 8 sectors in the second item of rewritten data 130-2 form a third data portion; data 150-5 of the last 1 sector of the second item of rewritten data 130-2, padding data 150-6, and padding data 150-7 for unavailable storage zone 120-3 form a fourth data portion; and the third item of rewritten data 130-3 forms a fifth data portion. Additionally, the storage manager can generate the consecutive write requests based on the multiple data portions. Based on this approach, the write requests can correspond to the storage page sizes of the storage area, thereby ensuring alignment of data.

In some implementations, in response to a request to reconstruct backup metadata for storage area 110, storage manager 320 can reconstruct the backup metadata based on the zone length of unavailable storage zone 120=3, wherein the backup metadata indicates a distribution of the multiple storage zones. Specifically, in the event that backup metadata 210 as shown in FIG. 2 is corrupted, storage manager 320 can reconstruct the VBM file using the zone length (e.g., 6 sectors) indicated in the reference zip header that is rewritten into unavailable storage zone 150-7, wherein such a VBM file is capable of indicating the distribution of multiple storage zones 120.

Based on the methods discussed above, the embodiments of the present disclosure are able to construct large consecutive write requests, thereby improving the write performance of the storage system. In addition, by effectively retaining the zone length information for the unavailable storage zone, the embodiments of the present disclosure are also able to support the reconstruction of backup metadata, thereby improving the stability of the storage system.

Figure 6:
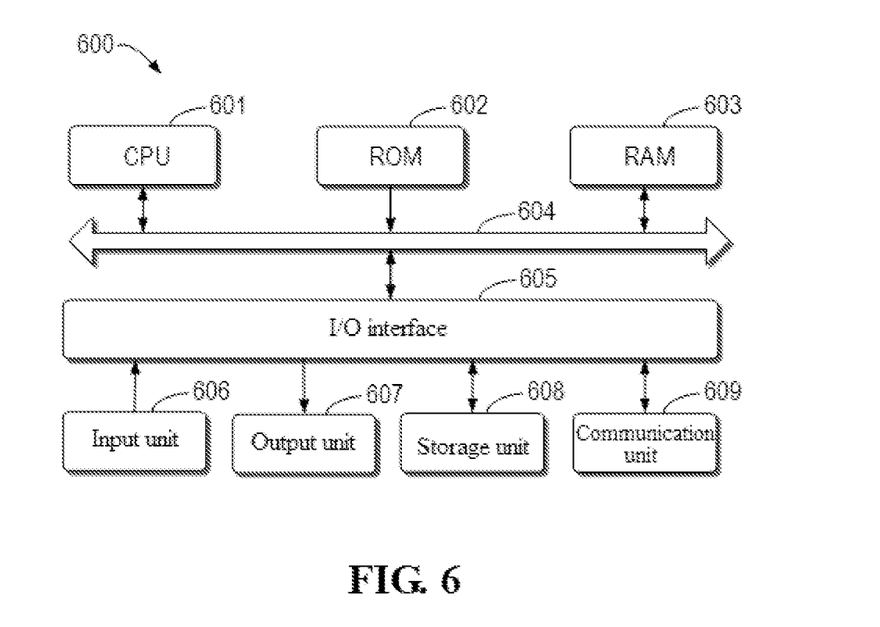
FIG. 6 illustrates a schematic block diagram of an example device that can be used to implement embodiments of the present disclosure.

FIG. 6 illustrates a schematic block diagram of example device 600 that can be used to implement the embodiments of the content of the present disclosure. For example, storage manager 320 according to the embodiments of the present disclosure may be implemented by device 600. As shown in the figure, device 600 includes central processing unit (CPU) 601 that may perform various appropriate actions and processing according to computer program instructions stored in read-only memory (ROM) 602 or computer program instructions loaded from storage unit 608 into random access memory (RAM) 603. In RAM 603, various programs and data required for the operation of the device 600 can also be stored. CPU 601, ROM 602, and RAM 603 are connected to each other through bus 604. Input/output (I/O) interface 605 is also connected to bus 604.

Multiple components in device 600 are connected to I/O interface 605, including: input unit 606, such as a keyboard and a mouse; output unit 607, such as various types of displays and speakers; storage unit 608, such as a magnetic disk and an optical disk; and communication unit 609, such as a network card, a modem, and a wireless communication transceiver. Communication unit 609 allows device 600 to exchange information/data with other devices via a computer network, such as the Internet, and/or various telecommunication networks.

The various processes and processing described above, such as process 400, may be executed by processing unit 601. For example, in some embodiments, process 400 may be implemented as a computer software program that is tangibly included in a machine-readable medium, for example, storage unit 608. In some embodiments, part or all of the computer program may be loaded and/or installed to device 600 via ROM 602 and/or communication unit 609. When the computer program is loaded into RAM 603 and executed by CPU 601, one or more actions of process 400 described above may be implemented.

The present disclosure may be a method, an apparatus, a system, and/or a computer program product. The computer program product may include a computer-readable storage medium on which computer-readable program instructions for performing various aspects of the present disclosure are loaded.

The computer-readable storage medium may be a tangible device that can hold and store instructions used by an instruction execution device. For example, the computer-readable storage medium may be, but is not limited to, an electric storage device, a magnetic storage device, an optical storage device, an electromagnetic storage device, a semiconductor storage device, or any suitable combination of the foregoing. More specific examples (a non-exhaustive list) of computer-readable storage media include: a portable computer disk, a hard disk, a random access memory (RAM), a read-only memory (ROM), an erasable programmable read-only memory (EPROM or a flash memory), a static random access memory (SRAM), a portable compact disc read-only memory (CD-ROM), a digital versatile disc (DVD), a memory stick, a floppy disk, a mechanical encoding device, for example, a punch card or a raised structure in a groove with instructions stored thereon, and any suitable combination of the foregoing. The computer-readable storage medium used herein is not to be interpreted as transient signals per se, such as radio waves or other freely propagating electromagnetic waves, electromagnetic waves propagating through waveguides or other transmission media (e.g., light pulses through fiber-optic cables), or electrical signals transmitted through electrical wires.

The computer-readable program instructions described herein can be downloaded from a computer-readable storage medium to various computing/processing devices, or downloaded to an external computer or external storage device via a network, such as the Internet, a local area network, a wide area network, and/or a wireless network. The network may include copper transmission cables, fiber optic transmission, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium in each computing/processing device.

Computer program instructions for performing the operations of the present disclosure may be assembly instructions, instruction set architecture (ISA) instructions, machine instructions, machine-related instructions, microcode, firmware instructions, state setting data, or source or object code written in any combination of one or more programming languages, wherein the programming languages include object-oriented programming languages, such as Smalltalk and C++, and conventional procedural programming languages, such as the "C" language or similar programming languages. Computer-readable program instructions may be executed entirely on a user's computer, partly on a user's computer, as a stand-alone software package, partly on a user's computer and partly on a remote computer, or entirely on a remote computer or a server. In the case involving a remote computer, the remote computer can be connected to a user's computer through any kind of network, including a local area network (LAN) or a wide area network (WAN), or it can be connected to an external computer (for example connected through the Internet using an Internet service provider). In some embodiments, an electronic circuit, for example, a programmable logic circuit, a field programmable gate array (FPGA), or a programmable logic array (PLA), is personalized by utilizing state information of the computer-readable program instructions, wherein the electronic circuit may execute computer-readable program instructions so as to implement various aspects of the present disclosure.

Various aspects of the present disclosure are described herein with reference to flowcharts and/or block diagrams of the method, the apparatus (system), and the computer program product according to embodiments of the present disclosure. It should be understood that each block of the flowcharts and/or block diagrams and combinations of blocks in the flowcharts and/or block diagrams can be implemented by computer-readable program instructions.

These computer-readable program instructions can be provided to a processing unit of a general-purpose computer, a special-purpose computer, or a further programmable data processing apparatus, thereby producing a machine, such that these instructions, when executed by the processing unit of the computer or the further programmable data processing apparatus, produce means (e.g., specialized circuitry) for implementing functions/actions specified in one or more blocks in the flowcharts and/or block diagrams. These computer-readable program instructions may also be stored in a computer-readable storage medium, and these instructions cause a computer, a programmable data processing apparatus, and/or other devices to operate in a specific manner; and thus the computer-readable medium having instructions stored includes an article of manufacture that includes instructions that implement various aspects of the functions/actions specified in one or more blocks in the flowcharts and/or block diagrams.

The computer-readable program instructions may also be loaded to a computer, a further programmable data processing apparatus, or a further device, so that a series of operating steps may be performed on the computer, the further programmable data processing apparatus, or the further device to produce a computer-implemented process, such that the instructions executed on the computer, the further programmable data processing apparatus, or the further device may implement the functions/actions specified in one or more blocks in the flowcharts and/or block diagrams.

The flowcharts and block diagrams in the drawings illustrate the architectures, functions, and operations of possible implementations of the systems, methods, and computer program products according to various embodiments of the present disclosure. In this regard, each block in the flowcharts or block diagrams may represent a module, a program segment, or part of an instruction, the module, program segment, or part of an instruction including one or more executable instructions for implementing specified logical functions. In some alternative implementations, functions marked in the blocks may also occur in an order different from that marked in the accompanying drawings. For example, two successive blocks may actually be executed in parallel substantially, or they may be executed in an opposite order sometimes, depending on the functions involved. It should be further noted that each block in the block diagrams and/or flowcharts as well as a combination of blocks in the block diagrams and/or flowcharts may be implemented using a special hardware-based system that executes specified functions or actions, or using a combination of special hardware and computer instructions.

Various implementations of the present disclosure have been described above. The foregoing description is illustrative rather than exhaustive, and is not limited to the disclosed implementations. Numerous modifications and alterations are apparent to persons of ordinary skill in the art without departing from the scope and spirit of the illustrated implementations. The selection of terms used herein is intended to best explain the principles and practical applications of the implementations or the improvements to technologies on the market, or to enable other persons of ordinary skill in the art to understand the implementations disclosed herein.

The invention claimed is:

1. A method for data writing, comprising:
   determining an unavailable storage zone in multiple storage zones of a storage area, wherein each storage zone is used to store a zip header and compressed data corresponding to the zip header;
   acquiring a reference zip header for the unavailable storage zone, wherein the reference zip header includes metadata indicating a zone length of the unavailable storage zone; and
   generating consecutive write requests for the storage area based at least on target data to be written to the storage area and the reference zip header, so as to write the target data to available storage zones in the multiple storage zones;
   wherein acquiring the reference zip header includes:
      determining the zone length of the unavailable storage zone;
      determining an index for the reference zip header based on the zone length; and
      determining, based on the index, the reference zip header from a set of candidate zip headers corresponding to different zone lengths.

2. The method according to claim 1, wherein generating consecutive write requests for the storage area includes:
   generating zone padding data for the unavailable storage zone using the reference zip header, wherein the zone padding data includes the reference zip header and first padding data that is used to overwrite compressed data previously stored in the unavailable storage zone; and
   generating the consecutive write requests based at least on the target data and the zone padding data.

3. The method according to claim 2, wherein generating the consecutive write requests based at least on the target data and the zone padding data includes:
   if data in only a portion of the available storage zones in the multiple storage zones needs to be overwritten by the target data, determining a remaining portion of the available storage zones that does not need to be replaced with the target data;
   generating second padding data for the remaining portion; and
   generating the consecutive write requests based on the target data, the zone padding data, and the second padding data.

4. The method according to claim 3, wherein at least one of the first padding data and the second padding data is generated based on a predetermined value.

5. The method according to claim 3, wherein generating the consecutive write requests based on the target data, the zone padding data, and the second padding data includes:
   determining multiple data portions from the target data, the zone padding data, and the second padding data according to a storage granularity associated with the storage area, wherein the size of each data portion corresponds to the storage granularity; and
   generating the consecutive write requests based on the multiple data portions.

6. The method according to claim 1, further comprising:
   reconstructing, in response to a request to reconstruct backup metadata for the storage area, the backup metadata based on the zone length of the unavailable storage zone, wherein the backup metadata indicates a distribution of the multiple storage zones.

7. The method according to claim 1, wherein the unavailable storage zone is marked as unavailable in response to being recycled.

8. An electronic device, comprising:
   at least one processing unit; and
   at least one memory which is coupled to the at least one processing unit and stores instructions for execution by the at least one processing unit, wherein the instructions, when executed by the at least one processing unit, cause the device to perform actions including:
      determining an unavailable storage zone in multiple storage zones of a storage area, wherein each storage zone is used to store a zip header and compressed data corresponding to the zip header;
      acquiring a reference zip header for the unavailable storage zone, wherein the reference zip header includes metadata indicating a zone length of the unavailable storage zone; and
      generating consecutive write requests for the storage area based at least on target data to be written to the storage area and the reference zip header, so as to write the target data to available storage zones in the multiple storage zones;
   wherein acquiring the reference zip header includes:
      determining the zone length of the unavailable storage zone;
      determining an index for the reference zip header based on the zone length; and
      determining, based on the index, the reference zip header from a set of candidate zip headers corresponding to different zone lengths.

9. The device according to claim 8, wherein generating consecutive write requests for the storage area includes:
   generating zone padding data for the unavailable storage zone using the reference zip header, wherein the zone padding data includes the reference zip header and first padding data that is used to overwrite compressed data previously stored in the unavailable storage zone; and
   generating the consecutive write requests based at least on the target data and the zone padding data.

10. The device according to claim 9, wherein generating the consecutive write requests based at least on the target data and the zone padding data includes:
    if data in only a portion of the available storage zones in the multiple storage zones needs to be overwritten by the target data, determining a remaining portion of the available storage zones that does not need to be replaced with the target data;
    generating second padding data for the remaining portion; and
    generating the consecutive write requests based on the target data, the zone padding data, and the second padding data.

11. The device according to claim 10, wherein at least one of the first padding data and the second padding data is generated based on a predetermined value.

12. The device according to claim 10, wherein generating the consecutive write requests based on the target data, the zone padding data, and the second padding data includes:
    determining multiple data portions from the target data, the zone padding data, and the second padding data according to a storage granularity associated with the storage area, wherein the size of each data portion corresponds to the storage granularity; and
    generating the consecutive write requests based on the multiple data portions.

13. The device according to claim 8, wherein the actions further include:
reconstructing, in response to a request to reconstruct backup metadata for the storage area, the backup metadata based on the zone length of the unavailable storage zone, wherein the backup metadata indicates a distribution of the multiple storage zones.

14. The device according to claim 8, wherein the unavailable storage zone is marked as unavailable in response to being recycled.

15. A computer program product having a non-transitory computer readable medium which stores a set of instructions to perform data writing; the set of instructions, when carried out by computerized circuitry, causing the computerized circuitry to perform a method of:
determining an unavailable storage zone in multiple storage zones of a storage area, wherein each storage zone is used to store a zip header and compressed data corresponding to the zip header;
acquiring a reference zip header for the unavailable storage zone, wherein the reference zip header includes metadata indicating a zone length of the unavailable storage zone; and
generating consecutive write requests for the storage area based at least on target data to be written to the storage area and the reference zip header, so as to write the target data to available storage zones in the multiple storage zones;
wherein acquiring the reference zip header includes:
determining the zone length of the unavailable storage zone:
determining an index for the reference zip header based on the zone length; and
determining, based on the index, the reference zip header from a set of candidate zip headers corresponding to different zone lengths.

16. The computer program product according to claim 15, wherein generating consecutive write requests for the storage area includes:
generating zone padding data for the unavailable storage zone using the reference zip header, wherein the zone padding data includes the reference zip header and first padding data that is used to overwrite compressed data previously stored in the unavailable storage zone; and
generating the consecutive write requests based at least on the target data and the zone padding data.

17. A method for data writing, comprising:
determining an unavailable storage zone in multiple storage zones of a storage area, wherein each storage zone is used to store a zip header and compressed data corresponding to the zip header;
acquiring a reference zip header for the unavailable storage zone, wherein the reference zip header includes metadata indicating a zone length of the unavailable storage zone; and
generating consecutive write requests for the storage area based at least on target data to be written to the storage area and the reference zip header, so as to write the target data to available storage zones in the multiple storage zones;
wherein generating consecutive write requests for the storage area includes:
generating zone padding data for the unavailable storage zone using the reference zip header, wherein the zone padding data includes the reference zip header and first padding data that is used to overwrite compressed data previously stored in the unavailable storage zone; and
generating the consecutive write requests based at least on the target data and the zone padding data.

18. The method according to claim 17, wherein generating the consecutive write requests based at least on the target data and the zone padding data includes:
if data in only a portion of the available storage zones in the multiple storage zones needs to be overwritten by the target data, determining a remaining portion of the available storage zones that does not need to be replaced with the target data;
generating second padding data for the remaining portion; and
generating the consecutive write requests based on the target data, the zone padding data, and the second padding data.

19. The method according to claim 18, wherein at least one of the first padding data and the second padding data is generated based on a predetermined value.

20. The method according to claim 18, wherein generating the consecutive write requests based on the target data, the zone padding data, and the second padding data includes:
determining multiple data portions from the target data, the zone padding data, and the second padding data according to a storage granularity associated with the storage area, wherein the size of each data portion corresponds to the storage granularity; and
generating the consecutive write requests based on the multiple data portions.

* * * * *